(12) United States Patent
Hedberg et al.

(10) Patent No.: US 6,700,780 B2
(45) Date of Patent: Mar. 2, 2004

(54) APPARATUS FOR COOLING ELECTRONICS

(75) Inventors: Klas Hedberg, Stockholm (SE); Per-Olow Bjerkensjo, Tyreso (SE)

(73) Assignee: Emerson Energy Systems AB (SE)

( * ) Notice: Subject to any disclaimer, the term of this patent is extended or adjusted under 35 U.S.C. 154(b) by 0 days.

(21) Appl. No.: 10/240,178

(22) PCT Filed: Apr. 2, 2001

(86) PCT No.: PCT/SE01/00714
§ 371 (c)(1),
(2), (4) Date: Sep. 27, 2002

(87) PCT Pub. No.: WO01/76340
PCT Pub. Date: Oct. 11, 2001

(65) Prior Publication Data
US 2003/0141039 A1 Jul. 31, 2003

(30) Foreign Application Priority Data
Mar. 31, 2000 (SE) .............................................. 0001165

(51) Int. Cl.[7] .............................................. H05K 7/20
(52) U.S. Cl. ...................... 361/695; 165/48.1; 165/122; 219/209; 219/385; 361/678; 392/379; 454/184
(58) Field of Search ............... 165/48.1, 80.3, 165/121, 122–126; 454/184, 186; 312/236; 174/16.1; 219/209, 385; 392/379, 382; 361/678, 691–695, 724

(56) References Cited

U.S. PATENT DOCUMENTS

| | | | | |
|---|---|---|---|---|
| 4,147,299 A | * | 4/1979 | Freeman | 236/49.5 |
| 4,495,545 A | | 1/1985 | Dufresne et al. | |
| 4,735,258 A | * | 4/1988 | Patarino | 165/300 |
| 4,813,475 A | * | 3/1989 | Couvrette | 165/223 |
| 5,559,673 A | * | 9/1996 | Gagnon et al. | 361/695 |
| 5,718,628 A | | 2/1998 | Nakazato et al. | |
| 6,131,653 A | * | 10/2000 | Larsson | 165/228 |

FOREIGN PATENT DOCUMENTS

GB     2202681 A     9/1988

* cited by examiner

Primary Examiner—Gerald Tolin
(74) Attorney, Agent, or Firm—Harness, Dickey & Pierce, P.L.C.

(57) ABSTRACT

The present invention relates to an apparatus for supplying heat to directly cooled electronics. To ensure that directly cooled electronics are maintained at a temperature above 0° C., a circulation fan is provided in a transverse junction between an outlet duct and an inlet duct, for a recirculation flow of supplied cooling air, whereby outgoing hot air from the electronics, when necessary, may be mixed with the cold air, so as to raise the temperature of the cooling air to be supplied to the electronics.

5 Claims, 1 Drawing Sheet

APPARATUS FOR COOLING ELECTRONICS

CROSS-REFERENCE TO RELATED APPLICATIONS

This application is a National Stage of International Application No. PCT/SE01/0714, filed Apr. 2, 2001. This application claims the benefit of Sweden Serial No. 0001165-0, filed Mar. 31, 2000. The disclosure(s) of the above application(s) is (are) incorporated herein by reference.

FIELD OF THE INVENTION

The present invention relates to an apparatus for cooling electronics in accordance with the preamble of claim 1.

BACKGROUND OF THE INVENTION

It is known in the art to enclose and directly cool electronics inside an outdoor cabinet by means of air taken from the environment. To this end, air drawn into the outdoor cabinet via an inlet duct, passes by the electronics to be cooled, and leaves the outdoor cabinet via an outlet duct. The electronics emit heat to the air passing by, which increases the temperature, whereby the air leaving the outdoor cabinet gets a higher temperature than the air which is drawn into the outdoor cabinet.

However, one problem arises at low environment temperatures, since electronic components can be negatively affected by temperatures below 0° C. By providing a transverse junction having a controllable valve between the outlet duct and the inlet duct, some of or all of the heated air can be guided from the outlet duct to the inlet duct, whereby the temperature in the inlet duct may be increased, thereby avoiding damages to the electronics.

Such recirculation of air in outdoor cabinets is shown in GB 2,202,681 and U.S. Pat. No. 4,495,545. However, these valves require engines or other equipment for controlling opening and closing. This is an expensive and complicated solution.

SUMMARY OF THE INVENTION

This invention is directed to an apparatus as initially defined, and which is characterised in that a one-way valve is arranged in the outlet duct to be opened under influence of the air pressure of the heated air acting on the valve, so as to discharge air from the outlet duct. At the same time, a speed controlled fan is arranged in the transverse junction to draw air from the outlet duct, thereby controlling the amount of recirculated air to the inlet duct as well as the amount of discharged air leaving the outlet duct via the one-way valve. Hereby, recirculation of air to the inlet duct is simplified, since a passive control of the valve is possible for the opening and closing. Passive control of a valve does not require any direct mechanical engagement or engine for the opening and closing, and thereby does not require any automation and control equipment nor any energy supply from engines. Thus, a simplified way for ensuring that directly cooled electronics are maintained at a temperature above 0° C. is provided since the air heated by the electronics is mixed with cold air in the inlet duct, so as to increase the temperature of the air which is supplied to the electronics.

Preferably, guiding ribs are provided in connection to the transverse junction. Hereby, air flowing through the transverse junction when the fan is shut off is avoided.

Suitably, a heater is provided in the inlet duct. Hereby, at low temperatures and at cold starts, heated air may be supplied to the electronics.

Advantageously, a supervisory unit is provided to detect and register temperatures in the inlet duct and the outlet duct, so as to control, in dependence of these temperatures, the number of revolutions of the fan and the supply of heat of the heater. Hereby, an optimal cooling of the electronics may be achieved.

BRIEF DESCRIPTION OF THE DRAWINGS

The invention will now be further described by means of a preferred embodiment and with reference to appended drawings, on which.

DETAILED DESCRIPTION

Figure 1:
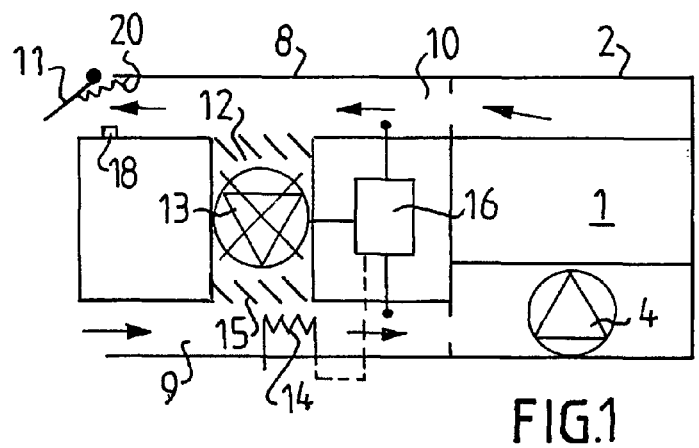
FIG. 1 shows, in accordance with the invention, directly cooled electronics inside an outdoor cabinet comprising a valve, a circulation fan for recirculation of outgoing air, and a heater, whereby the operation is shown at a temperature above 0° C.

FIG. 1 shows an apparatus 8 for cooling electronics 1 in an outdoor cabinet 2. Air from the environment is supplied directly to the electronics through a lower inlet duct 9 by means of a cooling fan 4 so as to cool the electronics. The heated air from the directly cooled electronics is guided through an upper outlet duct 10 via a one-way valve 11 back to the environment air. The one-way valve is adapted to let out heated air from the upper duct 10, but to prevent outdoor air entering the duct 10. The valve 11 is normally closed and is maintained closed by means of a spring 20, or alternatively, the weight of the valve. If an opening occurs, a higher pressure must be present on the right side of the valve, so as to overcome the spring force or the weight of the valve. Accordingly, it is the air pressure of the air, which is heated by the electronics, that enables an opening and thereby a discharge of air from the outlet duct. As soon as a sufficiently high pressure is no longer present, the valve 11 is closed under influence of the spring force or by its own weight. If a higher pressure is present on the left side, the valve remains closed. A protrusion 18 ensures that the valve only can be opened in one direction.

Between the upper duct and the lower duct, a transverse junction 12 is arranged having a controllable circulation fan 13, such as a speed controlled circulation fan. In the lower duct 9 a controllable heating device 14 is arranged, by means of which the air from the environment and the air from the transverse junction can be heated, so as to secure that the directly cooled electronics achieve a minimum temperature. By means of the circulation fan 13, outgoing air from the electronics may be supplied to the cold air, which is drawn into the electronics. The circulation fan 13 may also be arranged so as to circulate air during a cold start when neither the electronics 1 nor its cooling fan 4 are in operation. An inlet and outlet of the transverse junction may be provided with guiding ribs 15 or flanges for the guidance of the air flow. By means of a supervisory unit 16 the temperatures in the inlet duct is detected, as well as the number of revolutions of the circulation fan, and the supply of heat of the heating device.

When the outdoor temperature is above 0–5° C. the circulation fan 13 and the heating device 14 are inactive, and the outdoor air is drawn into the electronics 1 by means of the cooling fan 4 arranged in connection with the electronics 1. Hereby, the electronics are directly cooled whereby the heated air is guided into the upper duct 10 and then to the surrounding atmosphere, see FIG. 1.

Figure 2:
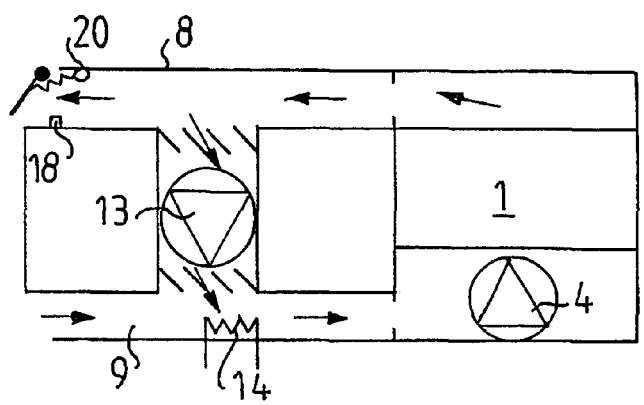
FIG. 2 shows the operation of the directly cooled electronics at an environment temperature below 0° C.

In FIG. 2 the operation of the apparatus 8 is shown at an environment temperature below 0° C. At temperatures below 0–5° C. the circulation fan 13 is in operation. By controlling the number of revolutions of the circulation fan, the amount of heated air to be supplied to the cooling air intended for the electronics 1 may be controlled along with the temperature of the air passing by the electronics. At very low temperatures and low heat emission of the electronics, heat may be supplied to the air flow by means of the heater 14 in the lower duct 9. If the circulation fan 13 would break down, heating of the air may be accomplished by means of the heater.

Figure 3:
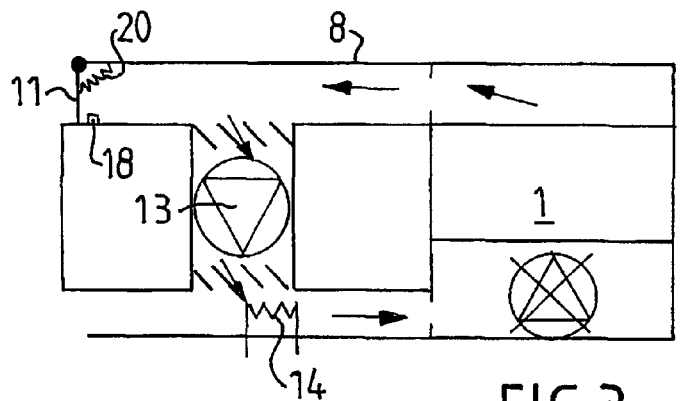
FIG. 3 shows the operation of the directly cooled electronics in FIG. 1 at a cold start.

At cold starts, when the environment temperature and the electronics have a temperature below 0° C., no heat will be emitted from the electronics and its cooling fan 4 will not be in operation. By means of a cold start function the electronics may be heated up to a temperature of 5° C. In FIG. 3 the operation at cold starts is shown whereby the one-way valve 11 is closed resulting in a circulating air flow. The air can then circulate through the electronics 1 by means of the circulation fan 13 and the air is heated by the heater 14. The one-way valve ensures that no air is drawn from the environment. Therefore, the circulation fan 13 is only drawing air from the electronics and blowing heated air to the electronics.

By means of the detection and registration of the temperatures inside the inlet duct and the outlet duct, the supervisory unit 16 can be adapted to control the number of revolutions of the circulation fan 13 as well as the heat supply of the heating device 14 so as to achieve an optimal cooling of the electronics.

Suitably, some form of filtration of the air before it is supplied to the electronics is arranged so as to protect the sensitive electronics from contaminations.

What is claimed is:

1. An apparatus for supplying heat at low temperatures to directly cooled electronics housed in an outdoor cabinet comprising:
   an inlet duct for supplying outdoor air to the electronics;
   an outlet duct for removing the outdoor air heated by the electronics; and
   a transverse junction arranged between the outlet duct and the inlet duct for enabling recirculation of the heated outdoor air from the outlet duct to the inlet duct, the transverse junction including:
   a one-way valve in the outlet duct opening in response to air pressure of the heated air to discharge air from the outlet duct; and
   a speed controlled fan in the transverse junction to draw air from the outlet duct to control the amount of recirculated air to the inlet duct and the amount of air discharged from the outlet duct through the one-way valve.

2. The apparatus according to claim 1, wherein guiding ribs are connected to the transverse junction.

3. The apparatus according to claim 1 wherein a heater is arranged in the inlet duct to heat air supplied to the electronics.

4. The apparatus according to claim 3 further comprising a supervisory unit, the supervisory unit sensing air temperatures inside the inlet duct and the outlet duct and varying the operation of the fan and operation of the heater in accordance with the sensed temperatures.

5. The apparatus according to claim 2 wherein a heater is arranged in the inlet duct to heat air supplied to the electronics.

* * * * *